United States Patent [19]

Hasegawa et al.

[11] Patent Number: 5,726,758
[45] Date of Patent: Mar. 10, 1998

[54] POSITION DETECTING SYSTEM

[75] Inventors: Masanobu Hasegawa, Fujisawa; Hiroshi Osawa, Yokohama, both of Japan

[73] Assignee: Canon Kabushiki Kaisha, Tokyo, Japan

[21] Appl. No.: 711,303

[22] Filed: Sep. 3, 1996

Related U.S. Application Data

[63] Continuation of Ser. No. 338,132, Nov. 9, 1994, abandoned.

Foreign Application Priority Data

Nov. 11, 1993 [JP] Japan ................... 5-305910

[51] Int. Cl.$^6$ ................... G01B 11/00
[52] U.S. Cl. ................... 356/401; 250/559.3; 356/375
[58] Field of Search ................... 356/399–401, 356/375; 250/548, 559.3

[56] References Cited

U.S. PATENT DOCUMENTS

| | | | |
|---|---|---|---|
| 4,037,969 | 7/1977 | Feldman et al. | |
| 4,514,858 | 4/1985 | Novak | 378/34 |
| 5,155,370 | 10/1992 | Osawa et al. | 356/401 |
| 5,200,800 | 4/1993 | Suda et al. | 356/401 |
| 5,285,259 | 2/1994 | Saitoh | 356/401 |
| 5,291,023 | 3/1994 | Hasegawa et al. | 250/548 |
| 5,313,272 | 5/1994 | Nose et al. | 356/401 X |
| 5,481,363 | 1/1996 | Matsugu et al. | 356/401 |

FOREIGN PATENT DOCUMENTS

| | | |
|---|---|---|
| 56-157033 | 12/1981 | Japan |
| 412523 | 1/1992 | Japan |
| 4-36605 | 2/1992 | Japan |
| 4148810 | 5/1992 | Japan |

*Primary Examiner*—K. Hantis
*Attorney, Agent, or Firm*—Fitzpatrick, Cella, Harper & Scinto

[57] ABSTRACT

A position detecting system and method for detecting the relative positional relationship between first and second objects disposed opposed to each other includes providing first and second marks on first and second objects, respectively, and irradiating one of the first and second marks with light from an irradiating light source. In addition, the other of the first and second marks is placed out of an irradiation region of the irradiating source and first diffraction light diffracted by one of the first and second marks is detected. Next, a first signal corresponding to the light intensity distribution of the first diffraction light is stored in memory. Both the first and second marks are then irradiated with light from the irradiation source and second diffraction light diffracted by both the first and second marks is detected. Next, a second detection signal corresponding to the light intensity distribution of the second diffraction light is stored in memory. Finally, the relative positional relationship between the first and second objects is determined on the basis of a third signal provided by excluding the stored first signal from the stored second signal.

8 Claims, 8 Drawing Sheets

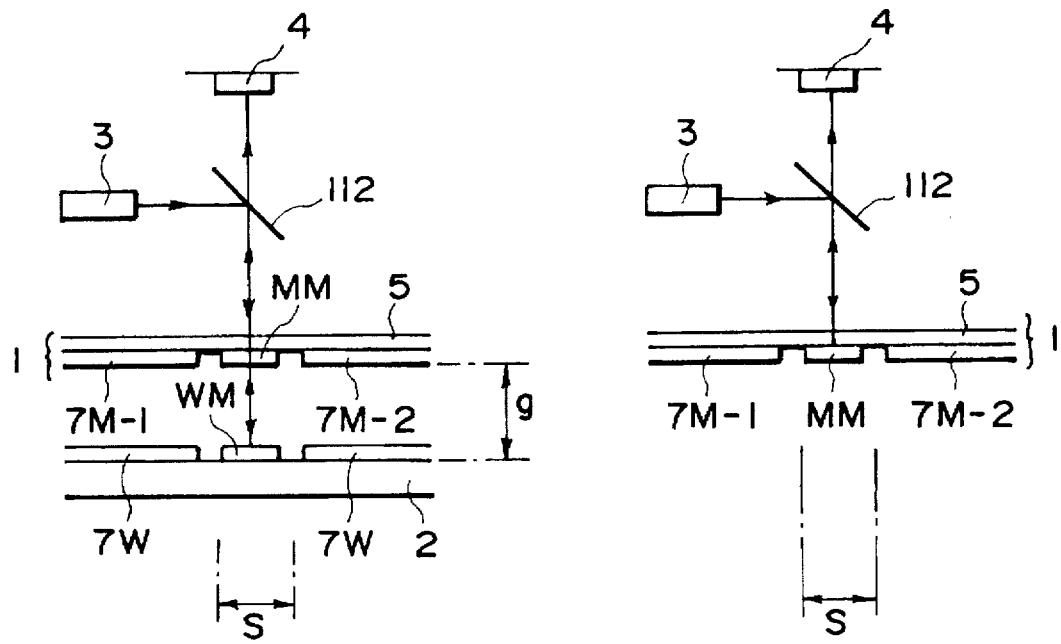
F I G. 4A  F I G. 4B
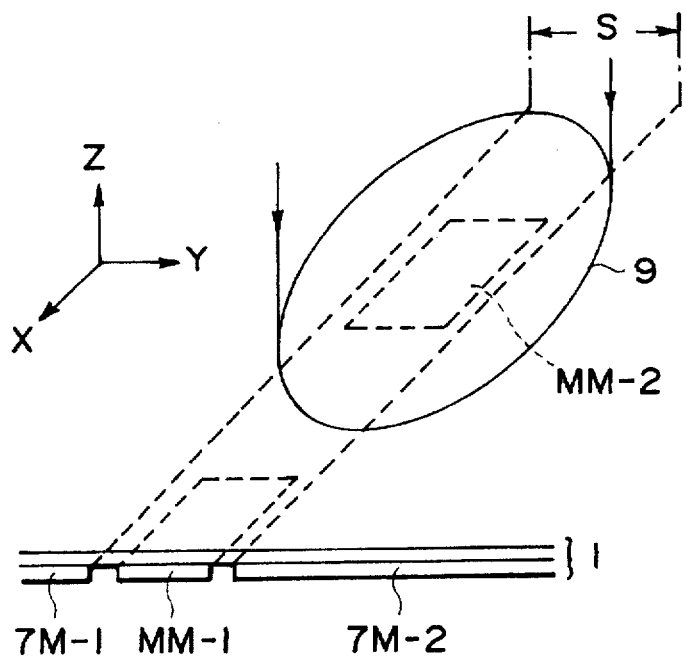
F I G. 5

POSITION DETECTING SYSTEM

This application is a continuation of application Ser. No. 08/338,132, filed Nov. 9, 1994 now abandoned.

FIELD OF THE INVENTION AND RELATED ART

This invention relates generally to a position detecting system. More particularly, the invention is concerned with an alignment method and a position detecting system using the same, which are particularly suitably usable in a semiconductor device manufacturing exposure apparatus, for example, for lithographically transferring a fine electronic pattern, formed on a first object such as a mask or a reticle (hereinafter simply "mask"), onto the surface of a second object such as a wafer, for detecting a relative positional deviation between the mask and the wafer along the plane of the mask/wafer or in a direction of the spacing therebetween, thereby to attain positioning (alignment) of them.

In semiconductor device manufacturing exposure apparatuses, relative alignment of a mask and a wafer is an important factor for improving the performance of the apparatus. More specifically, for this alignment process in recent exposure apparatuses, an alignment precision of a submicron or of a higher order is required in consideration of further increases in the degree of integration of each semiconductor device.

In many position detecting systems, alignment marks are provided on a mask and a wafer to aid in the positioning thereof, and relative alignment of them is carried out by using positional information obtainable from these marks. As an example of such alignment method, there is a method wherein relative deviation of alignment marks is detected on the basis of image processing. Another method is such as disclosed in U.S. Pat. Nos. 4,037,969 and 4,514,858 or in Japanese Laid-Open Patent Application, Laid-Open No. 157033/1981 wherein a zone plate is used as an alignment mark and light is projected to this zone plate, and the position of a light spot on a predetermined plane, formed by the light emitting from the zone plate, is detected.

Generally, an alignment method using a zone plate assures higher precision alignment as compared with an alignment method using a conventional alignment mark, because the former is less affected by any defect of the alignment mark.

In a position detecting system of the type 1) that an alignment mark having a wavefront transformation function is provided on a scribe line on the surface of a mask while an alignment mark having a wavefront transformation function is provided on the surface of a wafer, 2) that those components of light from a light projecting means as having been influenced by the wavefront transformation functions of both of these alignment marks on the mask surface and on the wafer surface are directed to a light receiving surface, and 3) that by detecting the incidence positions of the lights upon the light receiving surface, any relative positional deviation between the mask and the wafer is detected: there is a problem that light from the light projecting means may impinge on a region outside the alignment mark region on the mask surface, such as, for example, a region in which an IC pattern is formed.

If this occurs, unwanted light (noise light) such as diffraction light or scattered light is produced from that region outside the alignment mark region, which unwanted light may impinge on the light receiving surface, causing an error in alignment of the mask and the wafer.

SUMMARY OF THE INVENTION

It is accordingly an object of the present invention to provide an improved position detecting system by which the above-described problem can be solved.

It is another object of the present invention to provide an alignment method or a position detecting system using the same by which any noise component attributable to noise light produced from a portion other than an alignment mark region is detected beforehand and by which the noise component is removed, the removal of noise component being done on the basis of an output signal from a light receiving means, whereby high precision mask-to-wafer alignment is assured.

In accordance with a first aspect of the present invention, there is provided a position detecting the system for detecting relative positional relationship between first and second objects disposed opposed to each other, the system comprising: a first mark provided on the first object; a second mark provided on the second object; moving means for relatively moving the first and second objects relative to each other, in a direction parallel to an opposing direction in which the first and second objects are opposed to each other; irradiating means for providing light; light detecting means for detecting light from at least one of the first and second objects; control means for controlling the moving means to cause relative movement of the first and second objects so that one of the first and second marks is placed in an irradiation region of the irradiating means and the other of the first and second marks is placed out of the irradiation region such that first diffraction light, by the one of the first and second marks, is detected by the light detecting means, a first signal corresponding to the light intensity distribution of the first diffraction light is stored in first storing means, the control means further moving means to cause relative movement of the first and second objects so that both the first and second marks are irradiated with light from the irradiating means and placed in the irradiation region of the irradiating means such that second diffraction light, diffracted by both the first and second marks is detected by the light detecting means, whereby a second signal corresponding to the light intensity distribution of the second diffraction light is stored in second storing means; and determining means for determining the relative positional relationship between the first and second objects on the basis of a third signal provided by excluding the stored first signal from the stored second signal.

In one preferred form of this aspect of the present invention, each of the first and second marks has a lens function.

In one preferred form of this aspect of the present invention, the second diffraction light is collected onto a predetermined surface of said light detecting means.

In one preferred form of this aspect of the present invention, when the light from said irradiating means has a coherent length Lc, the Spacing g between the opposed first and second objects is set to satisfy Lc<2g.

In accordance with another aspect of the present invention, there is provided a position detecting method for detecting the relative positional relationship between first and second objects disposed opposed to each other, the method comprising the steps of: providing a first mark on the first object; providing a second mark on the second object; irradiating one of the first and second marks with light from irradiating means, placing the other of the first and second marks out of an irradiation region of the irradiating means, and detecting first diffraction light, diffracted by one of the first and second marks; storing a first signal corresponding to light intensity distribution of the first diffraction light; irradiating both the first and second marks with light from the irradiating means and detecting second diffraction light, diffracted by both the first and second marks; storing a second detection signal corresponding to the light intensity distribution of the second diffraction light; and determining the relative positional relationship between the first and second objects on the basis of a third signal provided by excluding the stored first signal from the stored second signal.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views, respectively, each for explaining the operation of the first embodiment.

FIG. 5 is a fragmentary enlarged view for explaining the operation of the first embodiment.

DESCRIPTION OF THE PREFERRED EMBODIMENTS

Figure 1:
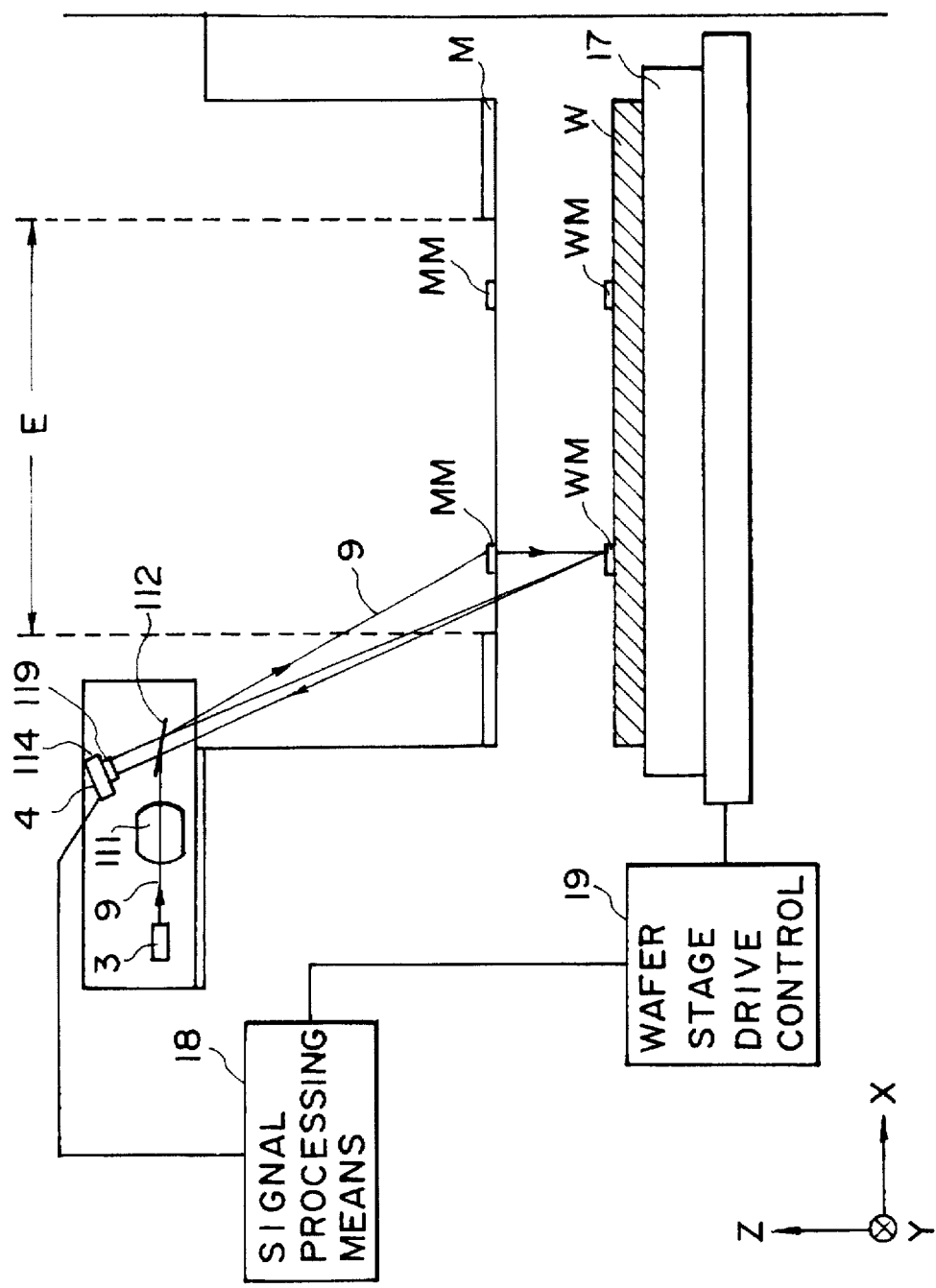
FIG. 1 is a schematic view of a main portion of a position detecting system according to a first embodiment of the present invention.
Figure 2:
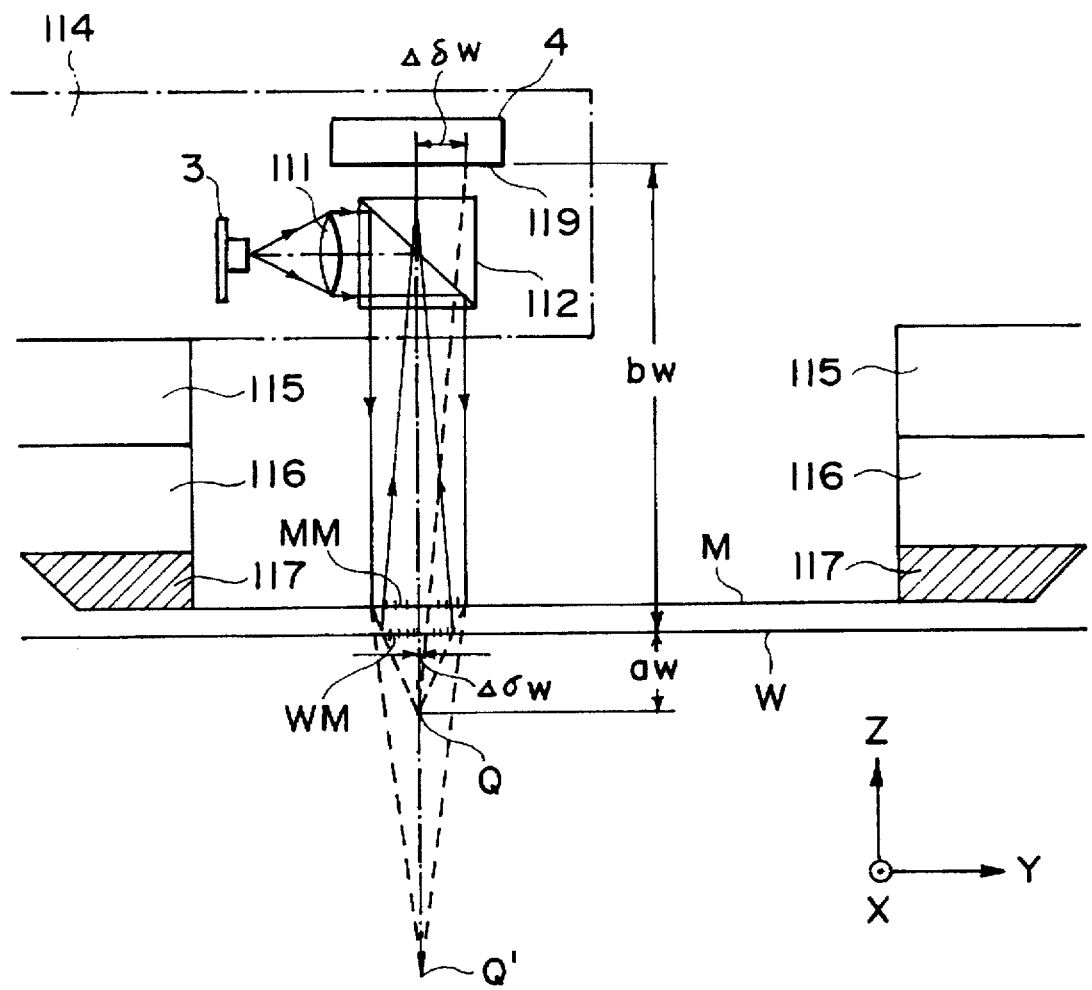
FIG. 2 is a front elevational view of a portion of the position detecting system of the FIG. 1 embodiment.
Figure 3:
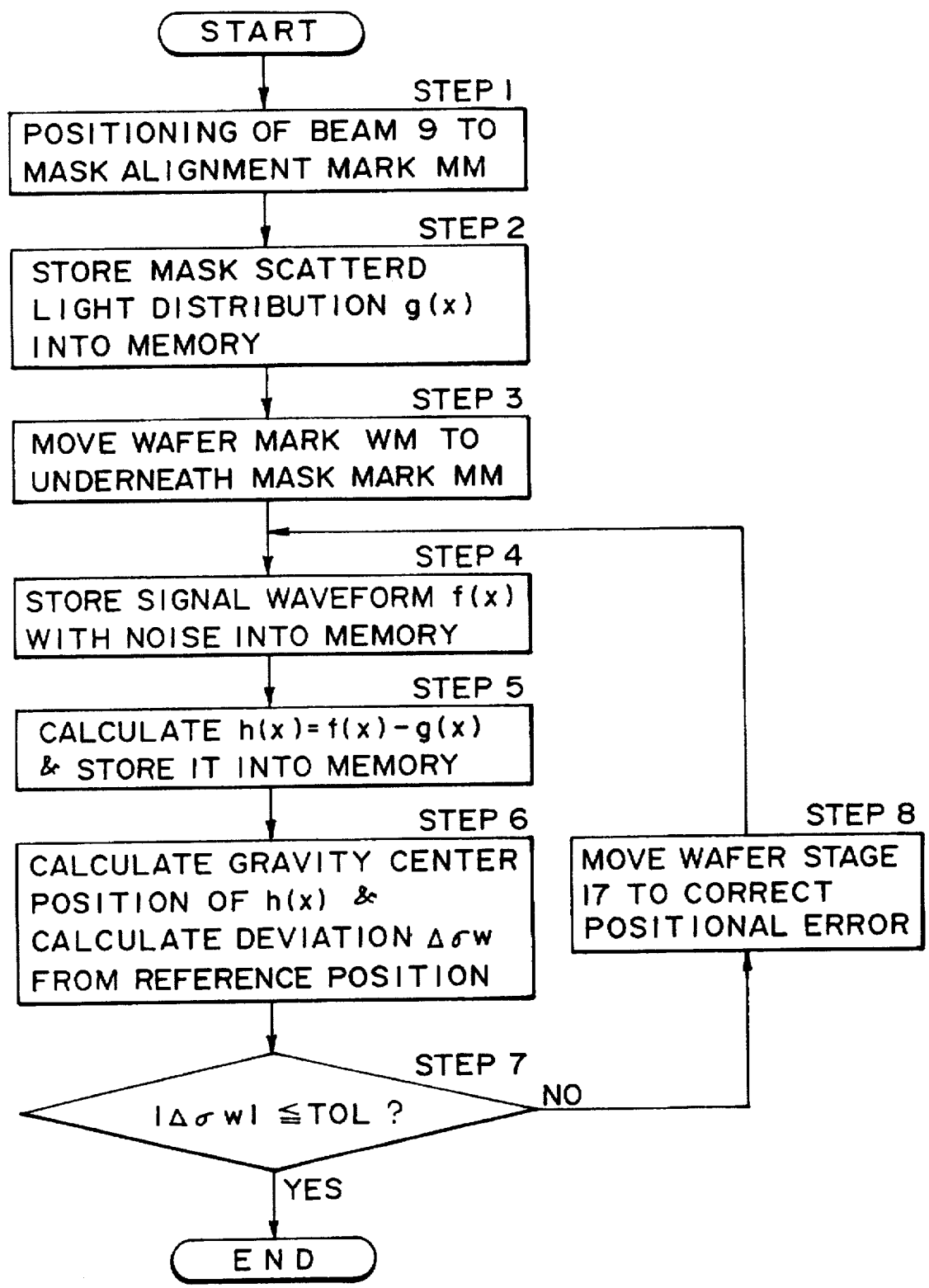
FIG. 3 is a flow chart of the operation to be made in the first embodiment.

Referring to FIGS. 1–5, a position detecting system according to a first embodiment of the present invention will be explained. FIG. 1 is a schematic view of a main portion of the position detecting system of the first embodiment. FIG. 2 is a front view of a main portion of the position detecting system. FIG. 3 is a flow chart of the operation to be made in this embodiment. FIGS. 4A, 4B and 5 are enlarged views, respectively, showing portions of the position detecting system in detail.

As illustrated, a mask M is disposed on a mask holder 117 which is supported by a main assembly 115 of an aligner through a mask chuck 116. Alignment head 114 is disposed at the top of the aligner main assembly 115. The mask M and a wafer W are provided with mask alignment marks MM and wafer alignment marks WM, respectively, for execution of alignment of the mask M and the wafer W.

Light 9 emitted by a light source 3, accommodated in the alignment head 114, is transformed by a light projecting lens system 111 into parallel light which travels to and is reflected by a half mirror 112 and impinges on the mask alignment mark MM. The mask alignment mark MM comprises a transmission type zone plate. It serves to diffract light incident thereon and, particularly, it has a convex lens function such that positive first order diffraction light therefrom is converged toward a point Q.

On the other hand, the wafer alignment mark WM comprises a reflection type zone plate, and it has a convex mirror function (diverging function) or a concave lens function such that the light converged at the point Q is reflectively diffracted and imaged upon a detection surface (sensor surface) 119.

Here, when a signal light having been reflectively diffracted to produce negative first order light by the wafer alignment mark WM goes through the mask alignment mark MM, it is not influenced by the lens function of the mark and it passes simply as zeroth order light and then is collected onto the detection surface 119.

If in the illustrated position detecting system there is a relative positional deviation of the wafer W relative to the mask M of a certain amount, in connection with this positional deviation amount Δσw, the position of incidence of the light (gravity center position of the quantity of light) impinging on the detection surface 119 is displaced. Here, there is a constant relationship between the positional deviation Δσw and the displacement Δδw on the detection surface 119, and thus the relative positional deviation Δσw between the mask M and the wafer W can be detected by detecting the displacement Δδw on the detection surface 119.

If the distance to the wafer W from the convergence point Q of a signal light emitting from the mask M is denoted by aw and the distance from the detection surface 119 from the wafer W is denoted by bw, then the displacement Δδw on the detection surface 119 can be expressed as follows:

$$\Delta\delta w = \Delta\sigma w \cdot \{(bw/aw)-1\} \qquad (a)$$

As readily understood from equation (a), the amount of the positional deviation is being magnified (bw/aw−1) times. This magnification (bw/aw−1) corresponds to the detection magnification.

As seen in FIG. 1, the light source 1 and the projecting lens system Ill are placed along the X-Z plane, and for convenience they are illustrated in FIG. 2 as being along the Y-Z plane.

The alignment head 114 can be moved by a pickup stage (not shown) and, by actuating this stage, the beam 9 can be positioned with respect to the mask alignment mark MM.

Denoted at 18 is signal processing means. In this embodiment, it comprises (i) a storage means for storing a reference waveform g(x) of a scattered light component (unwanted light) and a signal waveform f(x) obtainable at the sensor, (ii) a calculating means for calculating the waveform center position (e.g. gravity center) from a waveform h(x) based on the difference between the waveform f(x) and the waveform g(x), and (iii) a control means for causing the storage means to store a signal from the detector or for controlling a wafer stage drive controller 19 to drive a wafer stage.

Referring to FIG. 5, usually in a position detecting system of the type such as shown in FIG. 1, the light emitted from the light source 3 and projected by way of the half mirror 112 irradiates an alignment mark MM-2 on the mask side as a spot 9 having a finite size. In order that the whole alignment mark MM-2 is illuminated with parallel light having a uniform illuminance distribution, the spot size in the Y direction should necessarily be larger than the scribe line width S and, as a result, a portion of the light impinges on a region 7M-2 (FIG. 4A or 4B) in which an IC pattern is formed or any other mask region such as depicted at 7M-1.

The light impinging on such region is diffracted or scattered irregularly, and a portion of the thus diffracted or scattered light is mixed into the signal light as a noise and is received by the sensor 4. This causes a large detection error in the system in which the positional information related to an article to be examined is produced on the basis of the position of a light spot incident on the sensor, namely, on the basis of the intensity distribution (alignment signal waveform) of a measurement signal.

In consideration of such a problem, the position detecting system of this embodiment is provided with a sensor for measuring the waveform of an alignment signal, and a storage means for storing that waveform. Before execution of the alignment operation, an unwanted light component (noise component) to be produced in addition to a signal light in the alignment process is detected and stored previously. During the actual alignment operation, the unwanted light component is excluded from the alignment signal waveform and, thereafter, the positional information is produced. By this operation, a detection error attributable to the unwanted light and the resultant degradation of measurement reproducibility are avoided, and high precision alignment is accomplished.

Referring to the flow chart of FIG. 3, the manner of aligning a mask and a wafer in this embodiment will be explained.

In this embodiment, a signal waveform h(x) is produced by excluding, from a component f(x) obtainable by the sensor, any unwanted scattered light component g(x) being scattered by the mask surface. Then, on the basis of the thus produced signal waveform, the mask-to-wafer alignment is carried out.

In semiconductor device manufacturing processes, before IC pattern printing of each layer, mask replacement is carried out to load a mask to be used for the printing of the succeeding layer. After the mask is mounted, the positioning operation for positioning the mask with respect to the exposure apparatus is carried out. Usually this is called "mask alignment". After the mask alignment is completed, then the positioning operation for positioning an alignment beam with respect to a fine alignment mark (alignment mark of mask/wafer) is carried out (Step 1).

FIGS. 4B and 5 show this state. FIG. 5 illustrates that an alignment beam 9 impinges on a fine alignment mark MM-2 on the mask side, and FIG. 4B shows the same in a sectional view. Scattered light distribution g(x) from the mask M is measured in such state, and is stored in the memory (Step 2).

Figure 6A:
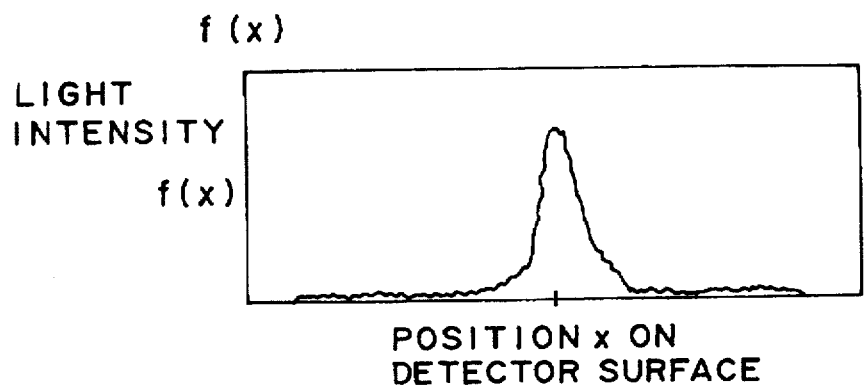
FIGS. 6A–6C are graphs, respectively, for explaining signals produced by a sensor of the FIG. 1 embodiment.
Figure 6B:
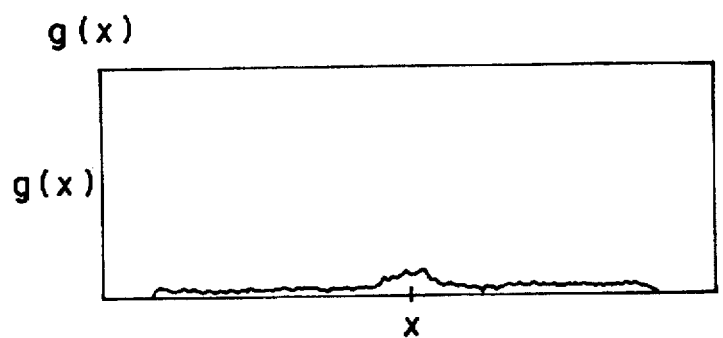

The alignment beam 9 is positioned with respect to the mask mark MM-2, but, since the diameter of the beam 9 in the Y direction is usually larger than the scribe line width S, a portion of the alignment beam also irradiates an IC pattern region 7M-2 and/or any other mask region 7M-1. The light impinging on the IC pattern region 7M-1 or mask region 7M-1 is diffractively scattered, irregularly, by an edge of the IC pattern or scattered by a surface irregularity of an absorbent material, and produces a speckle which is received by the sensor 4. FIG. 6B illustrate a waveform g(x) obtainable at this time at the sensor 4 on the basis of the scattered light.

Such a noise component from an IC pattern is not precisely reproducible for different masks, as a matter of course, since different masks have different shapes and since the speckle noise depends on the roughness of the mask surface.

However, in an alignment system such as of this embodiment wherein the light quantity distribution of alignment light upon a sensor surface itself provides positional information, a signal waveform which is reproducible to cancel out the noise due to the particular mask-to-wafer positional relationship is required. Therefore, the unwanted light such as described above is a cause for degradation of alignment precision. What is to be noted in the measurement of the waveform g(x) is not to place an article, having a reflectivity, below the mask mark MM. To the contrary, it may be preferable to place an article, absorptive to the alignment light, under the mask mark.

After the waveform g(x) based on the scattered light is measured by the sensor 4, the wafermark WM is moved and positioned under the mask mark MM (Step 3). FIG. 4A shows this state. This is the condition for normally obtaining an alignment waveform, and the light diffracted by the mask mark MM and the wafer mark WM, once by each mark, is received by the sensor 4 as an alignment signal.

Normally, the alignment light has a smooth waveform of good symmetry. However, due to the mixing with noise light as described, it has a non-smooth and asymmetric waveform such as a waveform f(x) shown in FIG. 6A. This waveform f(x) is stored into the memory (Step 4).

Figure 6C:
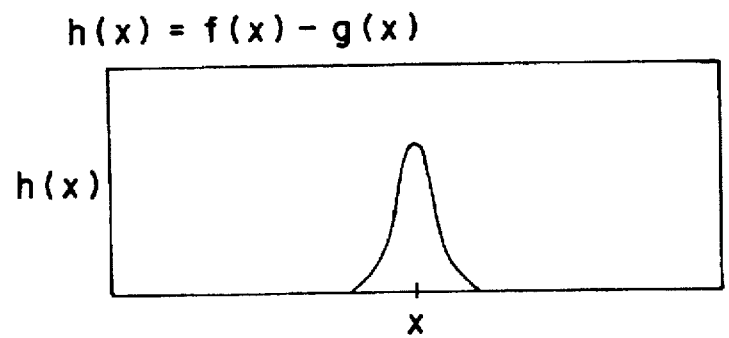

At Step 5, the output waveform g(x) as stored at Step 2 is subtracted from the output waveform f(x) of each bit of the line sensor 4 stored in the memory at Step 4, whereby a waveform h(x) is produced. In this waveform h(x), the waveform g(x) based on the direct scattered light component from the mask is excluded. As a result, such as shown in FIG. 6C, a waveform quite analogous to a normal alignment light waveform is obtainable.

On the basis of the thus produced waveform h(x), the gravity center position of the light incident on the sensor surface 119 is calculated and the displacement Δσw from the reference position is detected (Step 6). By this, high precision alignment which is not influenced by the shape of IC pattern of the mask is accomplished.

Figure 7:
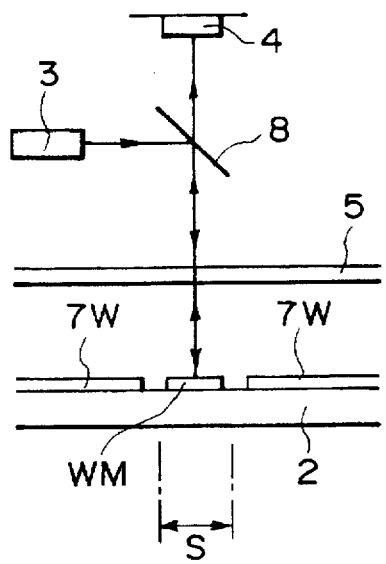
FIG. 7 is a schematic view of a portion of a position detecting system according to a second embodiment of the present invention.
Figure 8:
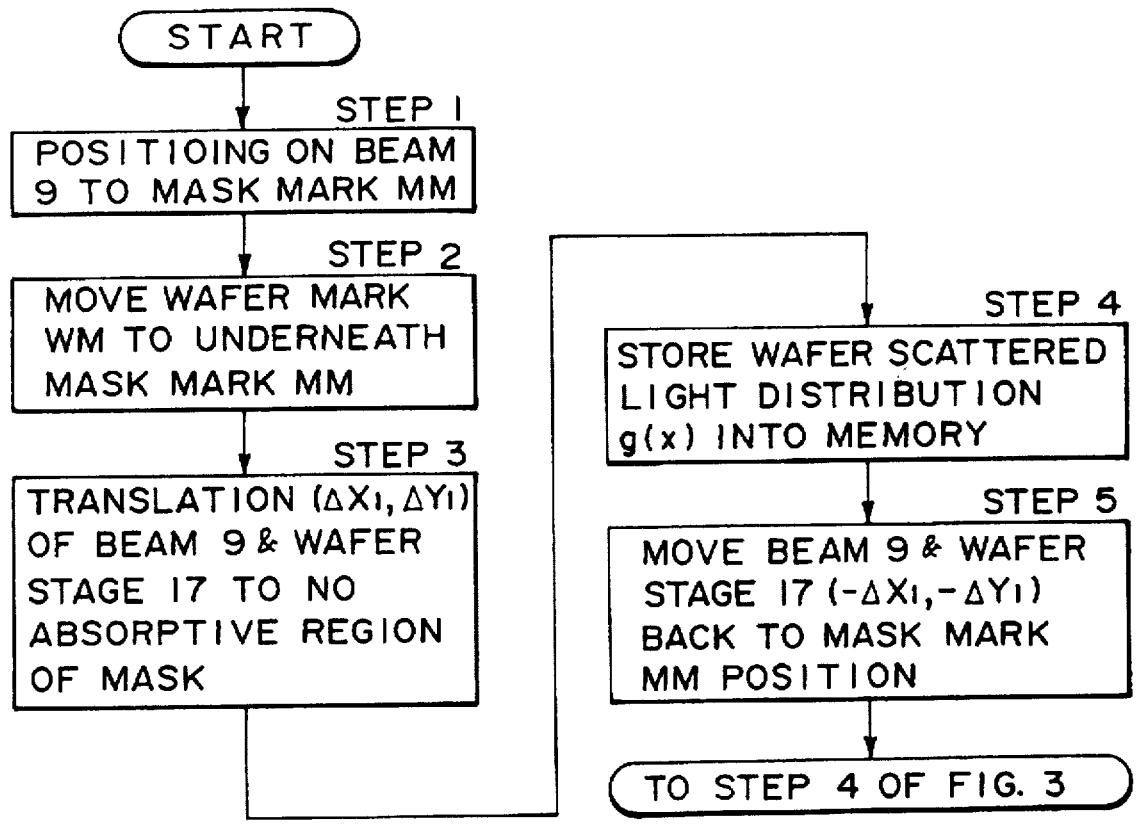
FIG. 8 is a flow chart for explaining the operation to be performed in the second embodiment.

FIG. 7 is a schematic view of a portion of a position detecting system according to a second embodiment of the present invention. FIG. 8 is a flow chart for explaining the operation of the second embodiment.

In this embodiment, any unwanted scattered light component g(x) from the surface of a wafer W is excluded from a component f(x) obtainable at the sensor, whereby a signal waveform h(x) is produced. The mask-to-wafer alignment is carried out on the basis of this signal waveform.

The operation of this embodiment will be explained in detail in conjunction with the flow chart of FIG. 8.

First, the alignment beam 9 is positioned with respect to the alignment mark MM of the mask M (Step 1), and then the wafer mark WM is moved and positioned under the mask mark MM. Thus, the alignment beam 9 and the wafer mark WM are held in a positional relationship for the alignment measurement.

Subsequently, while keeping the relative positional relationship of the alignment beam 9 and the wafer mark WM, the wafer stage 17 and the pickup stage for controlling the beam position are moved to a region of the mask M having no pattern, by a distance Δx1 and Δy1 (Step 3). This region having no pattern is prepared previously in addition to the IC pattern region and the alignment pattern region of the mask, and it has a size larger than the diameter of the alignment beam 9.

FIG. 7 shows this in a sectional view. In FIG. 7, denoted at 5 is a mask membrane which passes almost all the light received. Thus, the waveform g(x) as measured by the sensor at this time can be regarded as direct scattered light from the wafer W, and it is stored in the memory (Step 4).

After measurement of the waveform g(x), the beam 9 and the wafer mark WM are displaced as a unit by means of the pickup stage and the wafer stage 17, and moved back to a position below the mask mark MM (−Δx1, −Δy1) (Step 5). The subsequent procedure starts with Step 4 of FIG. 3, and sequential operations the same as the normal alignment sequence are carried out.

Figure 9:
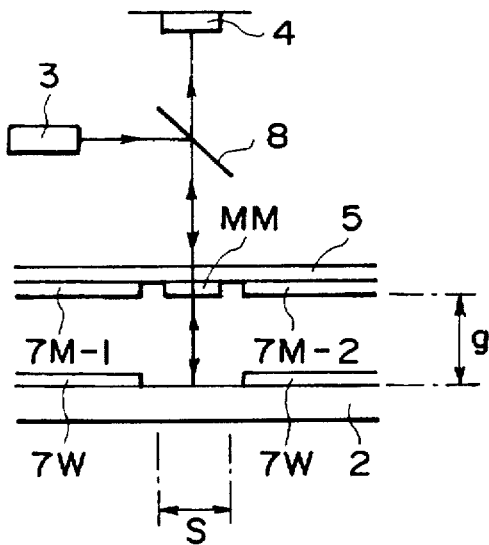
FIG. 9 is a schematic view of a portion of a position detecting system according to a third embodiment of the present invention.
Figure 10:
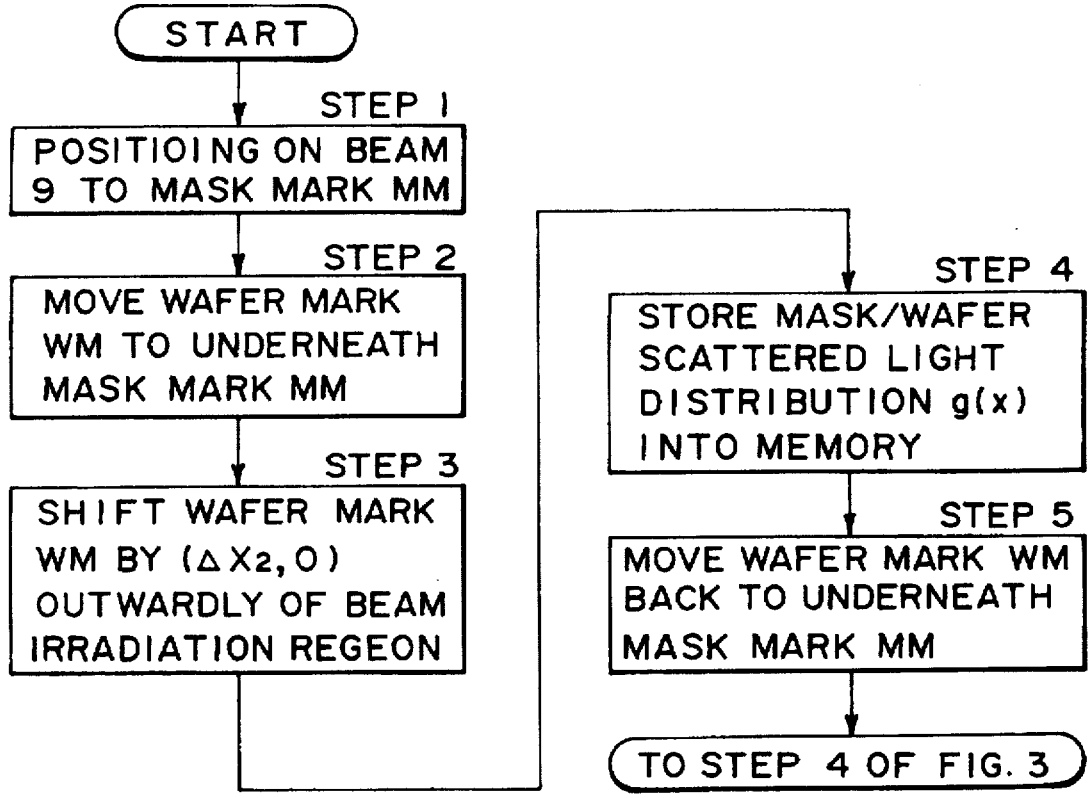
FIG. 10 is a flow chart for explaining the operation to be performed in the third embodiment.

FIG. 9 is a schematic view of a portion of a position detecting system according to a third embodiment of the present invention. FIG. 10 is a flow chart for explaining the operation of the third embodiment.

In this embodiment, unwanted scattered light components based on the mask surface and the wafer surface, respectively, are excluded simultaneously from a component f(x) obtainable at the sensor 4, whereby a signal waveform h(x) is produced. The mask-to-wafer alignment is carried out on the basis of this signal waveform.

The operation of this embodiment will be explained in detail in conjunction with the flow chart of FIG. 10.

The procedure up to Step 2 is the same as of the second embodiment of FIG. 8. At Step 3, the wafer stage is moved in the direction of the scribe line until the wafer mark MM goes out of the region 9 irradiated with the light beam, by a distance Δx2. If the diameter of the beam in this direction is denoted by Rx, then a relation Δx2>Rx/2 should be satisfied. FIG. 9 shows this state.

A major difference of this state in the present embodiment as compared with the state of FIG. 4A (alignment waveform measurement) resides in that there is no wafer mark WM. The signal waveform at this state is stored in the memory as a reference signal g(x) (Step 4).

Then, the wafer stage 17 is moved so as to place the wafer mark WM below the mask mark MM (Step 5). The subsequent sequential operation starts with Step 4 of FIG. 3, and operations the same as the normal alignment sequence are carried out.

This embodiment has a feature that direct scattered light (unwanted light) from the mask and wafer as well as diffraction light, including zeroth order diffraction light from the wafer, being unnecessary in this embodiment, are excluded.

The first to third embodiments of the present invention may be used selectively, such as follows:

In usual processes, the first embodiment will be effective. While a pattern of the mask is irradiated with about 100% of projected light, as regards the light impinging on a wafer mark, about 50% on average may be blocked by an absorptive material on the mask. With reciprocation, the light quantity may be reduced to about ¼.

Further considering the transmissivity of or absorption by a mask membrane, the total quantity of light may decrease near by one figure, and thus most of the unwanted light can be regarded as consisting of scattered light from the mask. As a more important point, when the relation between the alignment gap (spacing between the mask and the wafer) and the coherence length Lc of the alignment light is set to satisfy:

Lc<2×g (g is the alignment gap), there does not occur interference between the direct scattered light g(x) from the mask and the alignment signal light h(x). Thus, the waveform f(x) can be represented simply by the sum signal of the waveform g(x) and the waveform h(x). Therefore, the advantageous effects of this embodiment is exhibited more clearly.

The second embodiment may effectively apply in a case where the direct scattered light from a wafer is considerably stronger than that from a mask. For example, if aluminum (Al) is applied to a wafer by deposition, the reflectivity of the wafer becomes much higher than that of the mask. This embodiment may effectively apply to such a case.

The third embodiment may effectively apply in a case where unwanted light from a mask and a wafer have intensities of similar levels. In accordance with the third embodiment, substantially all unwanted light, other than the signal light, can be excluded as reference light. Thus, this embodiment provides practically high advantageous effects.

Figure 11:
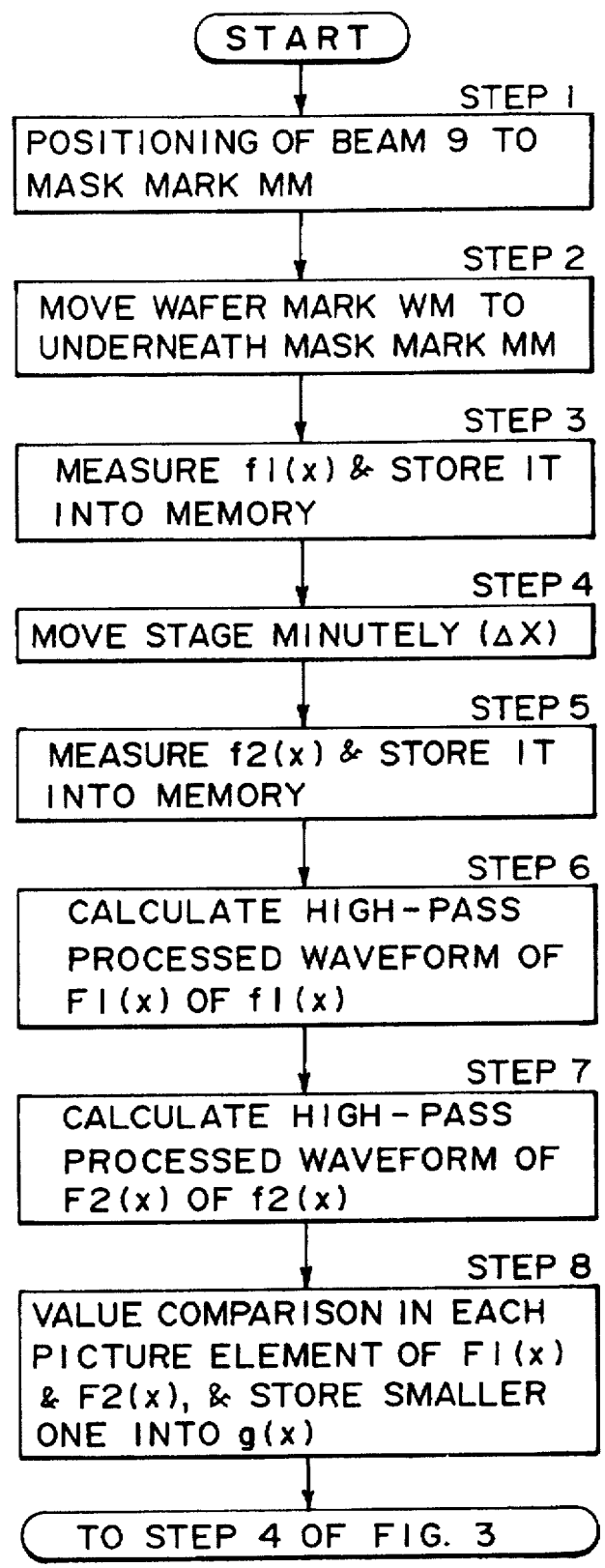
FIG. 11 is a flow chart for explaining the operation to be performed in a position detecting system according to a fourth embodiment of the present invention.

FIG. 11 is a flow chart of a mask-to-wafer alignment operation to be made in a position detecting system according to a fourth embodiment of the present invention.

The optical arrangement of this embodiment is substantially the same as that shown in FIG. 4A.

This embodiment has a feature that speckle noise of high frequency from a mask and a wafer is excluded. The operation of this embodiment will be explained in detail in conjunction with the flow chart of FIG. 11.

The procedure up to moving the wafer mark WM to the location below the mask mark MM, is the same as corresponding portion of the normal alignment sequence shown in FIG. 8 (Step 1 and Step 2). Subsequently, a signal waveform f1(x) is measured (Step 3). Then, the stage is moved in the alignment direction by a small amount Δx (Step 4), and a signal waveform f2(x) is measured (Step 5). Thereafter, the waveform f1(x) and the waveform f2(x) are processed by a high-pass filter (Step 6 and Step 8), whereby a waveform F1(x) and a waveform F2(x) are produced. Here, the high-pass filtering of the waveforms f1(x) and f2(x) is done to remove signal components.

Now, in the waveforms F1(x) and F2(x), noise of high frequency component and signal of high frequency component remain. The twice performed measurements for the waveforms f1 and f2 are executed in this embodiment so as to allow comparison of them and separation of the variable component and the fixed or unchangeable component.

More specifically, taking the variable component as a signal and taking the unchangeable component as noise, outputs of each picture element, (x) of the waveforms F1(x) and F2(x) are compared with each other, and the levels of smaller ones are taken as the levels of each picture element (g(x)). By doing so, it is possible to extract the waveform in the form of a high-frequency fixed noise component (Step 8).

Thus, the present embodiment is particularly effective to remove high frequency speckle noise.

The waveform g(x) is stored in a memory (Step 8). The succeeding operations start with Step 4 of FIG. 3, and sequential operations the same as the normal alignment sequence are carried out.

While in the foregoing description the invention has been described with reference to some examples wherein, during an alignment measurement operation, unwanted light components other than signal light is excluded, the present invention is applicable in a similar way also to an alignment system for measuring the spacing between a mask and a wafer, such as, for example, disclosed in Japanese Laid-Open Patent Applications, Laid-Open Nos. 12523/1992, 36695/1992 and 148810/1992.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system for detecting the relative positional relationship between first and second objects disposed opposed to each other, by using a first mark provided on the first object and a second mark provided on the second object and by using diffraction light diffracted by the first and second marks mixed with and spatially overlapping irregularly scattered or diffracted light representing noise, said system comprising:

moving means for relatively moving the first and second objects relative to each other, in a direction parallel to an opposing direction in which the first and second objects are opposed to each other;

irradiating means for providing light;

light detecting means for detecting light from at least one of the first and second objects;

control means for controlling said moving means to cause relative movement of the first and second objects so that one of the first and second marks is placed in an irradiation region of said irradiating means and that the other of the first and second marks is placed out of the irradiation region, such that first diffraction light diffracted by the one of the first and second marks is detected by said light detecting means, wherein the first diffraction light includes irregularly scattered or diffracted light representing noise, wherein a first signal corresponding to light intensity distribution of the first diffraction light is stored in first storing means, said control means further controlling said moving means to cause relative movement of the first and second objects so that both the first and second marks are irradiated with light from said irradiating means and placed in the irradiation region of said irradiating means such that second diffraction light, diffracted by both of the first and second marks, is detected by said light detecting means, the second diffraction light including light diffracted by the first and second marks mixed with and spatially overlapping the irregularly scattered or diffracted light representing noise, wherein a second signal corresponding to the light intensity distribution of the second diffraction light diffracted by the first and second marks and the noise is stored in second storing means; and determining means for determining the relative positional relationship between the first and second objects on the basis of a third signal provided by subtracting the stored first signal from the stored second signal.

2. A system according to claim 1, wherein each of the first and second marks has a lens function.

3. A system according to claim 1, wherein the second diffraction light is collected onto a predetermined surface of said light detecting means.

4. A system according to claim 1, wherein, when the light from said irradiating means has a coherent length Lc, the spacing g between the opposed first and second objects is set to satisfy Lc<2g.

5. A position detecting method for detecting the relative positional relationship between first and second objects disposed opposed to each other, by using a first mark provided on the first object and a second mark provided on the second object and by using diffraction light diffracted by the first and second marks mixed with and spatially overlapping irregularly scattered or diffracted light representing noise, said method comprising the steps of:

providing a first mark on the first object;

providing a second mark on the second object;

irradiating one of the first and second marks with light from irradiating means, while placing the other of the first and second marks out of an irradiation region of the irradiating means, to produce first diffraction light including irregularly scattered or diffracted light representing noise;

detecting the first diffraction light diffracted by the one of the first and second marks;

storing a first signal corresponding to light intensity distribution of the first diffraction light;

irradiating both the first and second marks with light from the irradiating means to produce second diffraction light including light diffracted by both the first and second marks mixed with and spatially overlapping the irregularly scattered or diffracted light representing noise;

detecting the second diffraction light;

storing a second signal corresponding to light intensity distribution of the second diffraction light including light diffracted by both the first and second marks mixed with and spatially overlapping the irregularly scattered or diffracted light representing noise; and determining the relative positional relationship between the first and second objects, on the basis of a third signal provided by subtracting the stored first signal from the stored second signal.

6. A method according to claim 5, wherein each of the first and second marks has a lens function.

7. A method according to claim 5, wherein the second diffraction light being collected onto a predetermined plane is detected.

8. A method according to claim 5, wherein, when the light from the light source has a coherent length Lc, the spacing g between the opposed first and second objects is set to satisfy Lc <2g.

* * * * *

UNITED STATES PATENT AND TRADEMARK OFFICE
CERTIFICATE OF CORRECTION

PATENT NO. : 5,726,758
DATED : March 10, 1998
INVENTOR(S) : MASANOBU HASEGAWA, ET AL.

It is certified that error appears in the above-identified patent and that said Letters Patent is hereby corrected as shown below:

COLUMN 1

Line 51, "lights" should read --light--.

COLUMN 2

Line 12, "relative" should read --the relative--.
Line 27, "means," should read --means, whereby--.
Line 30, "further" should read --further controlling the--.
Line 51, "Spacing" should read --spacing--.

COLUMN 5

Line 59, "illustrate" should read --illustrates--.

COLUMN 7

Line 64, "is" should read --are--.

UNITED STATES PATENT AND TRADEMARK OFFICE
CERTIFICATE OF CORRECTION

PATENT NO. : 5,726,758
DATED : March 10, 1998
INVENTOR(S) : MASANOBU HASEGAWA, ET AL.

It is certified that error appears in the above-identified patent and that said Letters Patent is hereby corrected as shown below:

COLUMN 8

Line 39, "element." should read --element--.
Line 54, "is" should read --are--.

Signed and Sealed this

First Day of December, 1998

Attest:

*Attesting Officer*

BRUCE LEHMAN
*Commissioner of Patents and Trademarks*